Figure 1:
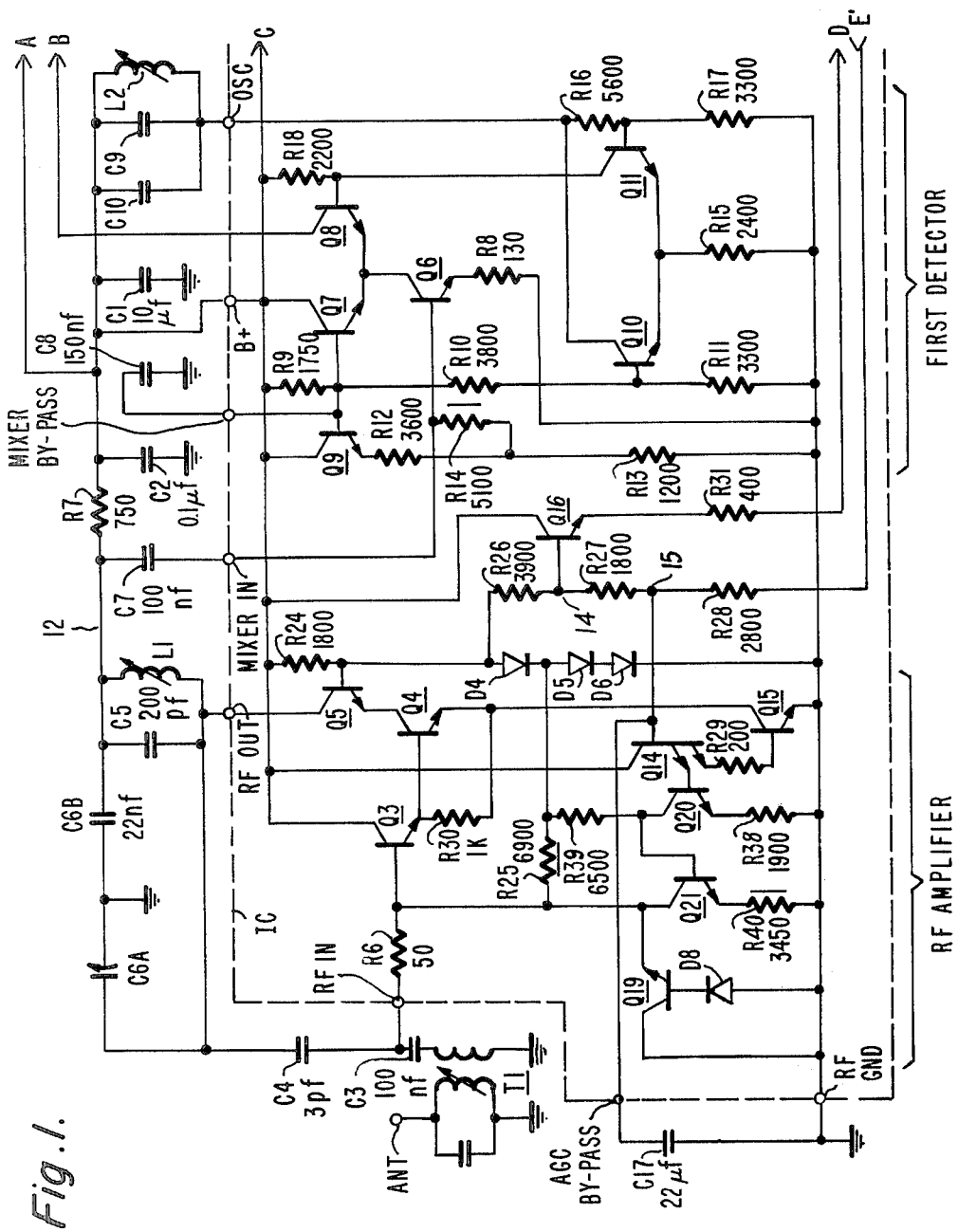

United States Patent [19]

Malchow

[11] 4,249,137
[45] Feb. 3, 1981

[54] AMPLIFIER SYSTEM WITH AGC, AS FOR AN AM RADIO

[75] Inventor: Max E. Malchow, Raritan Township, Hunterdon County, N.J.

[73] Assignee: RCA Corporation, New York, N.Y.

[21] Appl. No.: 968,443

[22] Filed: Dec. 11, 1978

[51] Int. Cl.$^3$ .............................................. H03G 3/30
[52] U.S. Cl. .................................... 330/283; 330/151; 330/279; 330/284; 330/285; 455/249
[58] Field of Search ............... 330/151, 279, 284, 285, 330/283; 325/319, 405, 404, 408, 413

[56] References Cited

U.S. PATENT DOCUMENTS

| 3,143,711 | 8/1964 | Read ..................................... | 330/285 |
| 3,264,564 | 8/1966 | Guggi .................................... | 325/411 |
| 3,421,100 | 1/1969 | Giontzeneli ........................ | 330/145 X |

*Primary Examiner*—James B. Mullins
*Attorney, Agent, or Firm*—Eugene M. Whitacre; Paul J. Rasmussen; Allen LeRoy Limberg

[57] ABSTRACT

A common-emitter-amplifier transistor with tuned collector circuit has its gain controlled by the variation of an emitter degeneration resistance responsive to an automatic gain control voltage. This emitter degeneration resistance is provided by the collector-to-emitter path of a gain-controlling transistor having relatively large emitter-base junction area and receiving the automatic gain control voltage at its base electrode. The amplifier transistor is provided temperature compensated base biasing so its emitter-follower action maintains its emitter electrode at a voltage, which applied as the emitter-to-collector voltage of the gain controlling transistor conditions the gain controlling transistor to operate in saturation. Under strong signal conditions the increase in emitter degeneration resistance reduces the severity of cross-modulation and inter-modulation effects. The disclosure describes an AM radio receiver using this type of automatic gain control for its r-f and i-f amplifier stages. Circuitry for avoiding overload distortion in the r-f amplifier is also described.

19 Claims, 2 Drawing Figures

AMPLIFIER SYSTEM WITH AGC, AS FOR AN AM RADIO

The present invention relates to amplifier systems with automatic gain control (AGC), of a type which is particularly well suited for amplitude-modulation (AM) radio receivers constructed in part in monolithic integrated circuit form.

Conventional AM radios employ common-emitter-amplifier transistors with tuned collector loads in their r-f and i-f amplifiers, the gains of which are controlled by forward or reverse AGC. In radios employing reverse AGC the emitters of the transistors are fully by-passed for r-f in the r-f amplifiers and at least partially, if not fully, in the i-f amplifiers; and capacitors are required for these purposes. These capacitors are of a size to make integration of them infeasible. They cooperate with the base-emitter junctions of the amplifier transistors, the emitter electrodes of which they by-pass, undesirably to provide AM detection that modulates the transconductances of those transistors, helping to give rise to cross-modulation and intermodulation effects. In any of the conventional reverse AGC arrangements, where the transconductance (or $g_m$) of the amplifier transistor is reduced by reducing its quiescent emitter-to-base potential (or $V_{BE}$) to reduce the level of collector-to-emitter current flowing through the transistor, the transistor can only rely on its increased internal emitter resistance ($1/g_m$) owing to AGC, for accommodating the increase in its input signal and is thus subject to non-linearity under strong signal conditions.

A common-emitter amplifier transistor that has its transconductance controlled by reverse AGC in accordance with present invention does not have its emitter degeneration resistance by-passed for r-f. Rather, its emitter degeneration resistance is controlled, being relatively small compared to the internal emitter resistance of the amplifier transistor when the gain of the amplifier stage is to be high under weak signal conditions, and being relatively large compared to the internal emitter resistance of the amplifier transistor when the gain of the amplifier stage is to be low under strong signal conditions. The relatively large emitter degeneration resistance under strong signal conditions substantially improves the linearity of the amplifier and reduces the susceptibility to cross-modulation and inter-modulation effects. In a practical monolithic integrated circuit the amplifier transistor will be a vertical-structure transistor to achieve a high transfer frequency or $f_T$ and, if it be in an early amplifier stage where its internally generated noise will be subsequently amplified and re-amplified, will have a fairly large emitter-base junction area to reduce its internal base contact resistance $r_{b'}$.

A preferred circuit for implementing gain control of an amplifier according to the present invention is to employ a gain-controlling transistor located on the same monolithic substrate as the amplifier transistor, which gain controlling transistor is of the same semiconductor material and conductivity type as the amplifier transistor, has its collector and emitter respectively connected to the amplifier transistor emitter and to signal ground, and has AGC voltage applied to its base electrode. For a range of signal strengths, the quiescent potential between the emitter electrode of the gain-controlling transistor and the amplifier transistor is maintained at such value, varying with temperature so as to compensate against the change in amplifier transistor $V_{BE}$, as to cause the gain-controlling transistor to operate in saturated conduction. Saturated conduction is desired so that the emitter-to-collector resistance of the gain-controlling transistor changes in response to variation in its $V_{BE}$. This resistance changes over a range that includes the internal emitter resistance ($1/g_m$) of the amplifier transistor; this is achieved by making the area of the base-emitter junction of the gain-controlling transistor several times that of the common-emitter-amplifier transistor.

A further aspect of the present invention concerns circuitry for avoiding a problem occurring in r-f amplifiers, gain-controlled as set forth in the preceding paragraph and parallelled with a feed forward circuit to feed r-f signal from the input to the output circuitry of the r-f amplifier. Under strong r-f input signal conditions there is a tendency towards non-linearity in the signal at the output circuit of the r-f amplifier owing to the loading of its input circuit upon the preceding circuitry—e.g. upon the antenna. This non-linearity problem is avoided by interrupting drive to the base electrode(s) of the r-f amplifier transistor(s) under strong signal conditions, responsive to the AGC voltage supplied to the r-f amplifier. Conduction of the r-f amplifier transistor(s) to cause distortion on peaks of high modulation is thus precluded.

Other inventive aspects of the AM radio receiver circuitry shown in the drawing will be described in the detailed description to follow.

Figure 2:
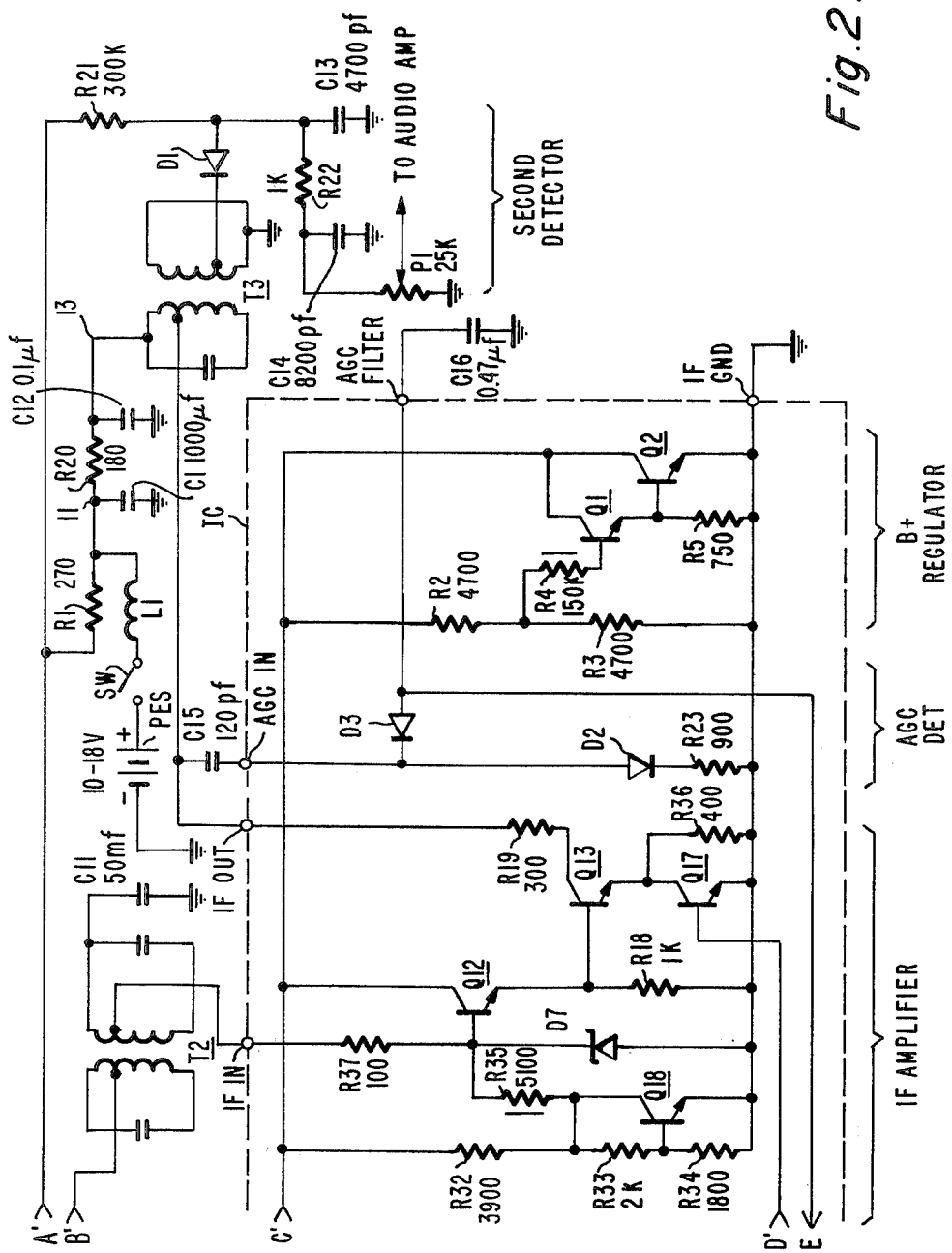

In the drawing:

FIG. 1 is a schematic diagram of the r-f amplifier and first detector portions of an AM heterodyne radio receiver; and FIG. 2 is a schematic diagram of the i-f amplifier, AGC detector, B+ voltage regulator, and second detector portions of that AM radio receiver, which receiver comprises an amplifier system with automatic gain control provided in accordance with the present invention.

In FIGS. 1 and 2 the apparatus enclosed within the dotted lines IC is constructed within the confines of a monolithic integrated circuit in preferred embodiments of the present invention. Since all the transistors are of NPN conductivity type, the cheapest conventional integrated circuit construction using junction-isolated vertical structure transistors disposed on a common substrate can be used. The semiconductor material used in the integrated circuit will conventionally be silicon. The smallest transistors on the circuit typically would exhibit an emitter-to-base offset potential (or $V_{BE}$) of 725 mV for 1mA of collector current flow and have a d-c common-emitter forward current gain or $h_{fe}$ of about 100. Connections A, B, C, D on the FIG. 1 portion of the AM receiver circuit are made to connections A', B', C', D' on the FIG. 2 portion, and connection E on the FIG. 2 portion is made to connection E' on the FIG. 1 portion. The primary energizing supply PES for the receiver is shown in FIG. 2 to be a battery supplying 10 to 18 volts, as may be encountered in an automobile having a nominally +12 volt electrical system; and conventional accommodations may be made to a −12 volt electrical system. The i-f amplifier AGC detector and B+ regulator portions of the integrated circuit IC, shown in FIG. 2, operate from a ground bus connected via terminal IF GND to a ground return to the supply PES. The substrate of the integrated circuit is provided with an ohmic contact connected to the IF GND terminal. The r-f amplifier and first detector portions of integrated circuit IC, shown in FIG. 1 operate from a separate ground bus connected via terminal RF GND to a ground return to the supply PES.

In FIG. 2 a switch SW selectively connects the positive pole of supply PES to the input of a supply filter comprising series arm inductor L1 and shunt leg capacitor C1. The output of this filter at node 11 supplies unregulated d-c to the audio amplifier portions of the radio receiver, not shown in the drawing, as well as to the earlier stages of the radio receiver shown in the drawing. A resistor R1 connects node 11 to the terminal B+ of the integrated circuit IC shown in FIG. 1 (this connection being via inter-connection A-A'). Terminal B+ connects to positive operating voltage busses used by the r-f amplifier and first detector of the FIG. 1 portion of the receiver, which latter bus also connects (via interconnection B-B') to the i-f amplifier and B+ regulator of the FIG. 2 portion of the receiver.

The B+ regulator includes means for dividing the voltage appearing between the IF GND and B+ terminals, shown as a resistive voltage divider comprising resistors R2 and R3 serially connected between those terminals. The interconnection of R2 and R3 is connected via a doubly diffused or "pinch" resistor R4 of relatively high resistance to the base of NPN transistor Q1. (Pinch resistors are indicated in a schematic diagram by the conventional resistor symbol with a straight line alongside.) Q1 is followed in Darlington cascade connection by another NPN transistor Q2. This Darlington cascade works in conjunction with R1 to provide for shunt regulation of the voltage appearing between the IF GND and B+ terminals. In doing this, the emitter-to-base voltage of Q2 is regulated to a value varying only 60 mV. or so around a nominal value near 700 mV. A resistor R5 connects the base and emitter of Q2; and the current flow therethrough attributable to the 700 millivolts or so there-across is made five times or so as large as the maximum base current of Q2, in order that the emitter current of Q1 is substantially constant. Now, the resistance of a pinch resistor, such as R4, varies in accordance with the common-emitter forward current gain $h_{fe}$ of a vertical-structure NPN transistor, such as Q1, in a monolithic i-c structure. So voltage regulation is substantially insensitive to process variation that affects $h_{fe}$.

The voltage $V_{B+}$ at the B+ terminal will be regulated to a value larger than the sum of the voltage drop $V_{R4}$ across resistor R4 and the emitter-to-base offset potentials (or $V_{BE}$'s) of Q1 and Q2, by a factor equal to the ratio by which B+ is divided in the resistive potential divider comprising resistors R2 and R3 with respective resistances $R_2$ and $R_3$. This can be expressed in equation form as follows.

$$V_{B+} = [(R_2+R_3)/R_3][V_{R4}+2V_{BE}]$$

As is well known, $V_{BE}$ decreases with increasing temperature.

However, it is desirable in an AM radio such as that shown in the drawing, wherein the amplifier stages are biased from multiple $-V_{BE}$ bias voltages with the currents used to develop the $V_{BE}$ drops being determined in rough proportion to $V_{B+}$ divided by resistance, that $V_{B+}$ increase with temperature. This is desirable in order to avoid the decrease in the $g_m$'s of the amplifier transistors as their emitter-to-base voltages, or $V_{BE}$'s, are reduced. This reduction of stage gains would be multiplicative in its effect and would seriously reduce the sensitivity of the AM radio receiver at higher operating temperatures. Accordingly, $V_{R4}$ should be made to increase with temperature more than the 2 $V_{BE}$ term decreases with temperature.

Since the ratio of the resistance $R_4$ of R4 to the common-emitter forward current gain $h_{feQ1}$ of Q1 is constant for reasons previously set forth, $V_{R4}$ will be in predictable ratio to the emitter current $I_{EQ1}$ of Q1, as set forth in the following expression.

$$V_{R4}=(R_4/h_{fe})I_{EQ1}$$

The emitter current $I_{EQ1}$ of Q1 has the value $V_{BE}/R_5$ as noted above, leading to the following expression.

$$V_{R4}=(R_4/h_{fe})(V_{BE}/R_5)$$

The strong positive temperature coefficient +2.5 parts per thousand per Kelvin of the R4 pinch resistance lets $V_{R4}$ exhibit the desired positive coefficient of temperature, even though $V_{BE}$ has a negative temperature coefficient of −1.75 mV per Kelvin and resistor R5 has a positive temperature coefficient of 1.8 parts per thousand per Kelvin.

But further, the operating temperature of the integrated circuit IC—or of any integrated circuit including shunt regulating devices—tends to increase with increased value of unregulated voltage supplied for regulation. This is because the shunt regulating devices pass more current with relatively little change in voltage under such conditions. The passage of more current necessarily requires greater $V_{BE}$ of Q2, increasing the current $I_{EQ1}=V_{BEQ2}/R_5$ and thus the $V_{R4}$ as well as the 2 $V_{BE}$ terms determining $V_{B+}$. This leads to $V_{B+}$ increasing with increase in the voltage $V_{PES}$ supplied by supply PES, when the voltage regulator shown in FIG. 2 is used. This is shown in the following table, which also shows that the sensitivity of the AM receiver for one watt output does not decrease appreciably with increased $V_{PES}$ over the range of $V_{PES}$ one expects normally to find in an automobile. The r-f input signal voltage $v_{RF-IN}$ is measured at the output of an r-f signal generator connected to drive the antenna terminal ANT at left of FIG. 1 through a 39 pF. equivalent antenna capacitance.

| $V_{PES}$(v) | $V_{B+}$(v) | $v_{RF-IN}$(mV) |
|---|---|---|
| 9 | 5.74 | 4.6 |
| 10 | 6.01 | 3.4 |
| 11 | 6.54 | 2.8 |
| 12 | 7.04 | 2.5 |
| 13 | 7.40 | 2.3 |
| 14 | 7.65 | 2.25 |
| 15 | 7.84 | 2.20 |
| 16 | 8.00 | 2.10 |
| 17 | 8.14 | 2.05 |
| 18 | 8.28 | 2.0 |

Capacitor C1 in the upper right corner of FIG. 1 provides the dominating roll-off in frequency response for the feedback loop conditioning the Darlington cascade connection of Q1 and Q2 to provide shunt regulation. C1 is parallelled by an r-f by-pass capacitor C2 disposed as to provide high-frequency decoupling between the r-f amplifier and the later stages of the receiver.

The passage of signals through the AM receiver will now be generally described, beginning at the antenna terminal ANT. A singly tuned r-f transformer (or antenna coil) T1 is arranged to couple radio signals received at antenna terminal ANT to the radio receiver; the output winding of T1 being connected via a d-c blocking capacitor C3 to a terminal RF IN of the integrated circuit IC and thence through a feedforward capacitor C4 to a terminal RF OUT of the integrated circuit IC. RF IN is the r-f input signal terminal for the r-f amplifier stage of the receiver being connected via a resistor R6 and by the emitter-follower, or common-collector-amplifier, action of an NPN transistor Q3 to the base of a NPN common-emitter-amplifier transistor Q4. Q4, which has reverse AGC applied together with emitter degeneration to its emitter has its collector connected to the terminal RF OUT by the common-base amplifier action of another NPN transistor Q5. Q4 and Q5 thus form a gain-controlled cascode amplifier working into a tank circuit including inductor L1 parallelled by a capacitor C5 resonating it in the range of the image frequency and parallelled by the series connection of capacitors C6A and C6B. C6A is the principal capacitance against which L1 tunes, and its capacitive transformer action with C6B provides transformed r-f signal at lower source-impedance-level to be applied through d-c blocking capacitor C7 to the MIXER IN terminal of IC. L1 is gang-tuned together with the primary winding of antenna coil T1 and inductor L2 in the local-oscillator tank circuit. Direct current for the collector of Q5 is supplied via resistor R7 from terminal B+ to a node 12 to be conducted by inductor L7 to the RF OUT terminal.

The amplified and transformed r-f signal applied to the mixer input terminal MIXER IN via C7 is in turn applied to the base of NPN transistor Q6 to modulate its conduction. To permit Q6 to handle larger input signals linearly, it is provided with an emitter degeneration resistor R8 for providing linearization by current feedback. Q6 provides a source of modulated tail current to the emitter-to-emitter connection of long-tailed-pair NPN transistors Q7 and Q8. The base electrodes of Q7 and another NPN transistor Q9 connect at a terminal MIXER BY-PASS for r-f by-passing to ground via capacitor C8.

The base electrodes of Q7 and Q9 also receive a direct bias potential from the interconnection of resistors R9 and R10. R9, R10 and a resistor R11 are connected serially in order of naming between the B+ and RF GND terminals. Q9 has a further resistive voltage divider in its emitter circuit. This divider includes resistors R12 and R13 connected serially in order of naming from the emitter of Q9 to RF GND, and a resistor R14 biases the base electrode of Q6 from the interconnection of R12 and R13. R14 is preferably a pinch resistor, as shown, so any variation of the $h_{fe}$ of Q6 during the course of manufacturing is compensated by the attendant variation in the resistance of R14 and thus the potential drop across R4. Q6 will operate at more constant collector current and thus at more constant $g_m$. The emitter-follower action of Q9 decouples the base of Q7 from amplified r-f signal appearing at MIXER IN and conducted by R14 and R12; and the negative temperature coefficient of its $V_{BE}$ causes slightly more positive base potential to be applied to Q6 with increased temperature to overcome the tendency for its $g_m$ to reduce with increased temperature. The divided voltage appearing at the interconnection of R10 and R11 is applied to the base of NPN transistor Q10 as its base potential $V_{BQ10}$.

The collector electrode of Q10 connects via a terminal OSC to the local-oscillator tank circuit comprising parallelled capacitors C9 and C10 in addition to inductor L12, which tunes with them and completes the path for direct current from B+ terminal to OSC terminal and the collector of Q10. The emitter of Q10 connects to RF GND through resistor R15 and limits the emitter current $I_{EQ10}$ of Q10 when NPN transistor Q11, connected emitter-to-emitter with Q10, is non-conductive. Q11 will be non-conductive and Q10, conductive when the base potential $V_{BQ11}$ of Q11 is appreciably less positive than $V_{BQ10}$; and Q11 will be conductive and Q10, non-conductive when $V_{BQ11}$ is appreciably more positive than $V_{BQ10}$. $V_{BQ11}$ is derived by potential division from the OSC terminal on the local-oscillator tank circuit, completing a regenerative feedback loop through the long-tailed-pair amplifier connection of Q11 and Q10 that sustains oscillations in the local oscillator tank. Resistors R15 and R16 connected serially in order of naming between the OSC and RF GND terminals form a resistive potential divider for this purpose, the interconnection between them providing $V_{BQ11}$. $V_{BQ11}$ varies sinusoidally at local-oscillator frequency to gate Q10 and Q11 into conduction on alternative half cycles of local-oscillator frequency. The potential divider comprising R16 and R17 is proportioned vis-a-vis the voltage divider comprising R9, R10, and R11 so the quiescent values of $V_{BQ10}$ and $V_{BQ11}$ are at the same design center voltages, with R9 being reduced in resistance to allow for the combined base currents of Q7 and Q9 increasing the potential drop thereacross. The resistance of R15 is chosen low enough respective to the resistance of the series connection of R16 and R17 so that regenerative loop including Q10 has sufficient gain to maintain oscillations in the local oscillator tank circuit.

The collector current of Q11 flows through a resistor R18, connecting the base electrode of Q8 to the B+ terminal, and switches Q8 out of conduction during the alternate half cycles of local oscillator frequency during which Q11 is switched into conduction. More particularly, Q8 is switched out of conduction by its base potential $V_{BQ8}$ being pulled down to a value substantially less positive than the base potential $V_{BQ7}$ of Q7, which is in emitter-to-emitter connection with Q8. During the alternate half cycles of local oscillator frequency when Q11 is switched out of conduction, so there is no potential drop across R18, $V_{BQ8}$ rises to $V_{B+}$ potential. This switches Q8 into conduction to divert all of the collector current of Q6 to flow as emitter current to Q8, thus switching Q7 out of conduction. So, the collector current of Q8 available at the MIXER OUT terminal of the integrated circuit IC is a heterodyne signal provided by the collector current of Q6, linearly modulated in accordance with amplified r-f signal, being chopped at local-oscillation rate. This provides extremely linear mixer action.

A novel aspect of the mixer is that the long-tailed-pair connection of Q7 and Q8 is not arranged so the respective quiescent base potentials $V_{BQ7}$ and $V_{BQ8}$ of Q7 and Q8 are nominally the same. The inventor has discovered that surprisingly the mixer has appreciably more conversion gain when the resistance of R18 is chosen smaller than one would for making $V_{BQ7}$ equal $V_{BQ8}$ when $V_{BQ11}$ equals $V_{BQ10}$, although the reason for this is not clear.

The heterodyne signal current flowing through the MIXER OUT terminal flows through interconnection B-B' to be coupled by the double-tuned first i-f transformer T2 to the i-f input signal terminal IF IN of the integrated i-f amplifier. Transformer T2 and the i-f amplifier stage now to be described appear in FIG. 2. The selectivity afforded by transformer coupling through T2 filters against r-f, the local oscillator frequency, and unwanted components of their heterodyning in favor of the intermediate frequency of choice. A capacitor C11 provides i-f ground to one end of the secondary winding of T2. The i-f signal at IF IN is applied via resistor R37 to the base of an NPN common-collector-amplifier transistor Q12, the emitter of which connects to the base electrode of an ensuing NPN common-emitter-amplifier transistor Q13. Q13 is reverse AGC'd with controlled degeneration at its emitter. Resistor R18, connecting the emitter of Q12 to ground, provides for substantially constant collector-to-emitter current flow for Q12, despite the change in the base current of Q13 as its gain is controlled by its reverse AGC. The collector of Q13 connects via resistor R19 to the i-f output signal terminal IF OUT of the integrated i-f amplifier and thence via the tapped primary winding of the second i-f transformer T3 to a node 13. Node 13 receives unregulated positive operating potential from node 11 via resistor R20. Capacitor C12 by-passes node 13 to ground for i-f and cooperates with R20 and C1 to form a low-pass pi-section filter that reduces unwanted coupling of amplified i-f back to the r-f amplifier and first detector stages.

The second i-f transformer T3, like the first i-f transformer T2, is double-tuned for better selectivity. Its secondary winding, grounded for r-f at one end thereof, is tapped for connection to the rectifying element of the second detector circuit. This rectifying element is a semiconductor diode D1 connected at its cathode to the tapped secondary winding and biased just into slight forward conduction by current flowing to its anode from the B+ terminal through a resistor R21 of relatively high resistance. Capacitor C13 connected between the anode of D1 and ground is the i-f filtering element of the second detector, and the audio-frequency component of the amplified and subsequently rectified i-f output signal appears across C13. In automobiles, which use slug-tuned inductors for selecting frequencies to be received, the intermediate frequency is commonly 262 kHz rather than 455 kHz, to ease tracking of the tuning inductors and to avoid the need for Litz wire in the i-f transformers. A low-pass L-section filter comprising series arm resistor R22 and shunt leg capacitor C14 is a "tweet" filter for suppressing harmonics of the i-f frequency which fall within the band of frequencies received by the AM radio. Potentiometer P1 connected across C14 is the volume control potentiometer which precedes an ensuing audio amplifier, not shown. While a simple potentiometer is shown, one with provision for bass boost could, of course, be used instead.

The amplified i-f signal appearing at the IF OUT terminal is applied via d-c blocking capacitor C15 to the input terminal AGC IN of the integrated AGC detector. This detector is in essence a Cockcroft voltage-doubler, although capacitor C16 at the output, AGC FILTER terminal of the circuit is many, many times larger than C15 at its input terminal AGC IN. It includes semiconductor diode D2 and resistor R23 in series connection between terminals AGC IN and IF GND in such poling as to conduct on the positive tips of amplified i-f signal, thereby discharging C15 to shift the average-value axis of the amplified i-f signal at the AGC IN terminal to a less positive voltage than appears under no-signal conditions. The AGC detector further includes a semiconductor diode D3 connected between the AGC IN terminal and an AGC FILTER terminal, which latter terminal is by-passed to ground for low frequencies by an AGC filter capacitor C16. D3 is so poled that C16 re-charges C15 on negative tips of the amplified and shifted i-f signal at the AGC IN terminal.

Referring back to the FIG. 1 portion of the integrated circuit IC, consider the string of serially connected semiconductor diodes D4, D5 and D6. Resistor R24 connects between B+ and the anode of D4 to provide a path for forward bias current to D4, to D5 connected at its anode to the cathode of D4, and to D6 connected at its anode to the cathode of D5 and at its cathode to RF GND. A "2 $V_{BE}$" voltage substantially twice the 700 mV or so offset potential across a semiconductor diode will appear at the interconnection of D4 and D5, and a "3 $V_{BE}$" voltage substantially thrice the 700 mV. or so will appear at the anode of D4. Diodes D2, D3, D4, D5 and D6 will in conventional integrated circuit constructions be formed from vertical-structure NPN transistors with emitter serving as cathode and with interconnected base and collector serving as anode; it is owing to this practice that the expressions "2 $V_{BE}$" and "3 $V_{BE}$" are used in describing offset potentials across series connections of these diodes. The +3 $V_{BE}$ voltage at the anode of D4 is applied directly to the base of Q5. The +2 $V_{BE}$ voltage at the interconnection of D4 and D5 is applied via resistor R25 to the base of Q3, tending to bias the serially connected base-emitter junctions Q3 and Q4 for conduction. Their base-to-emitter offset potentials reduce the +2 $V_{BE}$ voltage to place so low a collector potential on Q15 it must operate in saturation. R25 is made a pinch resistor to counteract the tendency towards reduction of the $g_m$'s of Q3 and Q4 as IC temperature rises.

The +3 $V_{BE}$ voltage is also the voltage against which the AGC detector works. A resistive potential divider comprising resistors R26, R27 and R28 connected serially in order of their naming between +$V_{BE}$ and the AGC FILTER terminal provides, firstly, a potential $V_{14}$ at node 14 between R26 and R27, which potential is used in controlling the i-f amplifier gain, and, secondly, a potential $V_{15}$ at node 15 between R27 and R28, which potential is used in controlling the r-f amplifier gain. Node 15 is by-passed to ground via the AGC BY-PASS TERMINAL connected by capacitor C17 to ground.

Current flows through the serially connected resistors R26, R27 and R29 and interconnection D-D' to forward-bias the diodes D3 and D2 in the AGC detector of FIG. 2. By reason of the potential divider action between—on the one hand—resistors R26, R27 and R28 of FIG. 1—on the other hand—diode D3 and D2 and resistor R23 of FIG. 2, the AGC FILTER terminal will be biased to a voltage somewhat larger than +2 $V_{BE}$ under no signal conditions. The voltage at the AGC FILTER terminal varies from +1.68 volts under no-signal conditions downward to +1.20 volts under very strong r-f input signal conditions. The potential divider action of R26 and R27 delays AGC to the i-f amplifier, maintaining Q17 in saturation over a greater portion of this voltage range than Q13 is maintained in saturation.

Node 15 is by-passed by a capacitor 17 connected between r-f ground and a terminal AGC BY-PASS of integrated circuit IC. C17 determines the AGC time constant together with the resistance of the series connection of R26, R27 and R28. C17 cooperates with R28 to provide further filtering of the AGC lines against residual amplified i-f on the AGC FILTER terminal. C17 cooperates with R27 and Q16 to decouple i-f coming back through the i-f AGC connections from being applied to the base of NPN transistor Q14 in the r-f AGC connections.

The voltage $V_{15}$ at node 15 between R27 and R28 is applied to the base of NPN common-collector transistor Q14, which has a first emitter connected via a resistor 29 to the base of a grounded-emitter NPN transistor Q15. The collector of Q15 connects to the emitter of the common-emitter r-f amplifier transistor Q4 for applying reverse AGC. Q15 operates in saturation, responding substantially linearly to applied base current to provide controlled conductance between its collector and emitter. The area of its base-emitter junction is 18 times that of the smallest transistor permitted by chip design rules. The ratio between the respective areas of Q15, Q4, and Q3 is 18:10:1.5. There is no need for an r-f by-pass capacitor between the emitter of Q4 and RF GND, saving a terminal on the integrated circuit IC. Q15 has the low emitter-to-collector potential needed to operate it in saturation assured, owing to the base electrode of Q3 having a $+2\ V_{BE}$ quiescent potential applied to it via R25. The emitter-follower action of common-collector r-f amplifier transistor Q3 places its emitter at a $+1\ V_{BE}$ potential, the effect of $h_{fe}$ variation in Q4 upon the emitter current of Q3 being minimized by paralleling the emitter-base junction of Q4 with a resistor R30 of relatively low resistance. The emitter follower action of Q4 then tends to place its emitter at a voltage near ground to guarantee the operation of Q15 in saturation. R29 buffers the emitter of Q14 from the low base impedance preferred by the saturated transistor Q15, so the potential at node 15 can maintain control of the base voltage $V_{BQ14}$ and so node 15 is not clamped in potential to attenuate gain control voltage variations at node 14 between resistors R26 and R27.

The voltage $V_{14}$ at node 14 between R26 and R27 is applied to the base of a common-collector NPN transistor Q16. The emitter of Q16 is connected via a buffering resistor R31 to the base of a grounded-emitter NPN transistor Q17, operated in saturation at low r-f input signal levels for applying reverse AGC to common-emitter i-f amplifier transistor Q13. That is, the scheme of gain control for the common-emitter i-f amplifier transistor Q13 is similar to the scheme of gain control for the common-emitter r-f amplifier transistor Q4. The base-emitter junction of Q17 has an area similar to that of Q15. The respective areas of the base-emitter junctions of Q17, Q13, and Q12 are in 18:4:1.5 ratio, Q12 being smaller. The biasing of the base of Q13, so that Q17 may operate in saturation at low r-f input signal levels, is carried out as follows.

Grounded-emitter NPN transistor Q18 has its collector connected to B+ via a collector load resistor R32. Q18 is provided with direct-coupled collector-to-base feedback by the potential divider action of resistors R33 and R34 having respective resistances $R_{33}$ and $R_{34}$. This feedback tends to increase the conduction of Q18 to the point where the voltage drop across R32 reduces the emitter-to-collector voltage $V_{CEQ18}$ of Q18 to $[(R_{33}+R_{34})/R_{34}]$ times $V_{BE}$, the emitter-to-base voltage of Q18 having a nominal value $V_{BE}$ over a range of current owing to the logarithmic relationship of this voltage to transistor to its level of conduction. $R_{33}$ and $R_{34}$ are so proportioned that $V_{CEQ18}$, applied via resistor R35 to the base electrode of Q12, is slightly in excess of $+2\ V_{BE}$. R35 is made a pinch resistor to counteract the tendency towards reduction of the $g_m$'s of Q12 and Q13 as IC temperature rises. The emitter-follower action of Q12 responds to this quiescent base potential with a quiescent emitter potential slightly in excess of 1 $V_{BE}$, applied as quiescent base potential to Q13. The emitter-follower action of Q13 then applies a sufficiently low collector potential to Q17 to operate it in saturation at all but the lowest current levels, encountered under very strong r-f input signal conditions. Resistor R36 connects the emitter electrode of Q13 to IF ground, providing the principal path for conducting the emitter current of Q13 under these very strong r-f input signal conditions.

Consider no-signal conditions, when the voltage V15 at node 15 and the AGC BY-PASS terminal is $+1.68$ V. $V_{14}$ at node 14 will be about midway between that voltage and $+3\ V_{BE}$—i.e. 1.85 V.—forward biasing the serially connected base-emitter junctions of Q16 and Q17 and conditioning Q17 for maximum conduction. Q17 accordingly operates in saturation, providing a high conductance path from the emitter of common-emitter i-f amplifier transistor Q13 to IF GND, which additionally tends to make the emitter potential $V_{EQB}$ of Q13 less positive, increasing the forward-bias upon its base-emitter junction and thereby conditioning Q13 to exhibit high transconductance. A $V_{15}$ of $+1.68$ V conditions Q14 and Q15 for maximum conduction, increasing the conductance of Q15 between the emitter of common-emitter r-f amplifier transistor Q4 and ground, and thereby conditioning Q4 to exhibit high transconductance. Both the r-f and i-f amplifiers exhibit their maximum gains and will have their gains reduced but little for weak r-f input signal conditions.

Under less weak r-f and normal input signal conditions—e.g., from 0.1 to 10 mV.—the voltage at the AGC FILTER terminal in response to higher amplified i-f signal will decrease, so that $V_{14}$ is reduced sufficiently to cut back conduction in Q14 and Q15 and subsequently in Q4. This reduces the r-f amplifier gain to reduce overall receiver gain, it being desirable to reduce r-f amplifier gain before i-f amplifier gain to reduce the noise generated in the earlier stage as r-f input signal strengthens. At the same time the increased emitter degeneration of Q4 increases the capability of the r-f amplifier to amplify larger i-f input signals without distorting them.

Under stronger r-f input signal conditions—e.g., above 5 mV.—the continuing decrease in the voltage at the AGC FILTER terminal responsive to still higher amplified i-f signal, will result in $V_{15}$ being reduced sufficiently to cut back conduction in Q16 and Q17. The decreased conductance presented by Q17 between IF GND and the emitter electrode of Q13 will reduce the transconductance of Q13, both in effect and in actuality, reducing i-f amplifier gain together with continued reduction in r-f amplifier gain.

At still stronger r-f signal levels—e.g., above 50 mV.—the gain of the r-f amplifier will be very much reduced, so the r-f signal fed forward from the RF IN terminal to the RF OUT terminal via feed-forward capacitor C4 will be larger than the "amplified" r-f signal supplied from the output of the gain controlled r-f amplifier. Continued receiver gain reduction will then for all practical effect take place in the gain-controlled i-f amplifier. The use of the feed forward capacitor around the r-f amplifier avoids the flat AGC characteristic that is disfavored because of the difficulties it causes in tuning an AM channel accurately without a visual tuning indicator; rather the output of the radio receiver increases gently with increasing r-f input signal so one can tune according to the loudness of the radio.

Avalanche conduction by the base-emitter junctions of the r-f amplifier furnishes Q3 and Q4 shown in FIG. 1, while the collector-substrate junction of Q15 conducts in the forward direction, would be deleterious to Q3 and Q4. Electrostatic charges applied between the RF GND and RF IN terminals during handling of the integrated circuit IC prior to its connection to the other portions of the radio or during lightning storms after connection in the radio present the danger of such avalanche conduction. Such avalanche conduction is precluded by the clamping action of a "Darlington diode" configuration of diode D8 and NPN transistor Q19 connected at its anode to RF GND and its cathode to the base electrode of Q3, preventing the base of Q3 going more than 2 $V_{BE}$ more negative than the potential at RF GND. (D8 can be an NPN transistor with its collector and base connected to RF ground and with its emitter connected to the base of Q19, to complete the Darlington cascade connection of that transistor with Q19.)

Avalanche conduction over the collector-substrate junction of Q21 cannot afford protection against electrostatic potentials between RF GND and RF in terminals since the substrate of the integrated circuit IC is connected to IF GND to avoid "tweet" problems. Resistor R1 limits the current flow through the Darlington diode on noise peaks caused by r-f static and during input signal overload conditions. Common-collector r-f amplifier transistor Q1 precedes common-emitter r-f amplifier transistor Q2 so that no loss of signal occurs by potential divider action between R1 and the base circuit of Q2.

R19 limits the amplitude of current flow through the collector-substrate junction of Q13 should negative voltage accidentally be imposed between the IF GND and IF OUT terminals. D7 prevents the avalanche conduction of the base-emitter junctions of Q12 and Q13 owing to electrostatic potentials being applied between IF GND and IF IN terminals during the handling of IC between manufacture and installation in a radio. R37 limits the amplitude of current flow through D7 should negative voltage accidentally be imposed between the IF GND and IF IN terminals.

The AM radio receiver as thus far described offers better automatic gain control operation than ones built around existing integrated circuits; its distortion and cross-modulation characteristics under strong signal conditions, is superior where the signal fed forward from RF IN to RF OUT via C4 exceeds the amplified r-f, reaching only 7.6% at 90% modulation at 50 mV r-f input signal strength; and its signal-to-noise performance under weak-signal conditions is superior. However, in subjecting the AM receiver to the variety of r-f input signal conditions the receiver might be expected to encounter in actual use, a problem was found with regard to linearity under very strong r-f input signal conditions, when modulation percentages were high and peak voltages at the RF IN terminal exceeded 100 millivolts or so. This lack of linearity was found by the present inventor to be due to the positive-swinging peaks of the large r-f input signal at the RF IN terminal being clamped by substantially increased conduction of them by the base-emitter junctions at Q1 and Q2.

This undesirable lack of linearity is forestalled in the present invention by interrupting the application of base drive to Q3 and thus to Q4 from the RF IN terminal at the strong signal levels where distortion would otherwise be incurred at high percentage modulation. While a variety of attenuator schemes can be used to achieve this end, a way to interrupt base drive to Q3 and Q4, which is preferred because of its relatively simplicity and low parts count, is to bias the base electrode of Q3 to a quiescent potential, sufficiently less positive than its normally $+2V_{BE}$ level, that the positive-swinging peaks of the r-f input signal at the RF IN terminal cannot bias the base-emitter junctions of Q3 and Q4 into conduction.

To carry out this preferred way of interrupting base drive to Q3 and Q4, the following circuitry is included in the FIG. 1 r-f amplifier. Transistor Q14, receiving at its base the AGC voltage $V_{15}$ for the r-f amplifier, is provided with a second emitter to supply by emitter-follower action a translated AGC voltage to the base of NPN transistor Q20. (Alternatively, of course, the dual-emitter transistor Q14 could be replaced with a pair of separate NPN transistors operated as emitter followers.) Q20 is connected as an inverting amplifier stage to generate a collector voltage $V_{CQ20}$ that is an amplified complement of the AGC voltage applied to its base. More particularly, Q20 is provided with a resistor R38 connecting its emitter to RF GND and with a resistor R39 connecting its collector to the $+2V_{BE}$ potential provided at the interconnection of diodes D4 and D5. $V_{CQ20}$ is applied to the base of a NPN transistor Q21. Q21 has its collector connected to the base of Q1, so that the pinch resistor R25 is in effect its collector load resistance, and has a resistor R40 connecting its emitter to RF GND. R40 is made a pinch resistor so its resistance tracks that of R25, despite changes in the temperature of integrated circuit IC or in the absolute values of the resistors on IC. R25 is a pinch resistor to compensate against $h_{fe}$ variation of Q4 over the course of manufacture affectings its $g_m$ appreciably.

So long as the AGC voltage $V_{15}$ is above the $+2V_{BE}$ voltage associated with weak and normal r-f input signal conditions, Q20 is biased into conduction to hold the base of Q21 so close in potential to that at RF GND that Q21 is maintained non-conductive. So Q21 does not affect the application of r-f input signal from terminal RF IN via R6 to the base of Q3. As strong r-f input signal levels where $V_{15}$ is reduced below $+2V_{BE}$ to reduce the gain of the r-f amplifier to low levels, $V_{15}$ is insufficiently large to maintain conduction through the serially connected base-emitter junctions of Q14 and Q20. Accordingly Q20 is biased for non-conduction. The cessation of its collector current lessens the potential drop across R39 and permits the $+2V_{BE}$ potential applied through R39 to the base electrode of Q21 to forward-bias the base-emitter junction of Q21. This forward biasing is strong enough to place Q21 in saturated conduction, causing potential divider action between pinch resistors R25 and R40 to reduce the quiescent potential at the base of Q3 to somewhat less than one volt under strong signal conditions. R-f input signals at the RF IN terminal may swing up to volt peaks before non-linearities associated with conduction of Q3 and Q4 are evidenced.

The present invention also finds use where signal from the input of the r-f amplifier is fed forward at lower impedance level to the mixer input, rather than to the r-f amplifier output. Numerous other embodiments of the present invention will occur to one skilled in the art and armed with the foregoing disclosure, and the following claims should be liberally construed to include such embodiments within their scope.

What is claimed is:

1. A gain-controlled amplifier with tuned load comprising:

first and second transistors of the same conductivity type having respectively small and respectively large area base-emitter junctions and having respective base, emitter and collector electrodes;

an input signal terminal;

a feed-forward capacitor connected between said input signal terminal and said tuned load means;

means for connecting the collector electrode of said first transistor to said tuned load means and to an operating voltage;

means connecting said second transistor for providing between its emitter and collector electrodes an electrically adjustable emitter degeneration resistance for said first transistor, controllable in response to the emitter-to-base potential of said second transistor, including a direct connection of the emitter electrode of said first transistor to the collector electrode of said second transistor, a connection of the emitter electrode of said second transistor to a reference voltage and signal ground, and means for applying a temperature-compensated quiescent potential between the emitter electrode of said second transistor and the base electrode of said first transistor that tends to maintain said second transistor in saturated conduction;

means responsive to the amplitude of the response to said input signal appearing at said tuned load for developing an automatic gain control voltage;

means for applying said automatic gain control voltage as the emitter-to-base potential of said second transistor; and means for selectively providing drive to the base electrode of said first transistor from said input signal terminal, including means for sensing when said automatic gain control voltage is of a level indicating that the amplitude of the response to said input signal appearing at said tuned load is sufficient, that the portion of that response attributable to input signal current fed forward through said feed-forward capacitor exceeds the portion of that response caused by the collector current of said first transistor, and including means responsive to that condition being sensed for interrupting drive otherwise provided to the base electrode of said first transistor from said input signal terminal.

2. In combination:

means for supplying input signal with a range of strengths; a common-emitter transistor amplifier having base, emitter and collector circuits;

means responsive to the amplitude of signal in said collector circuit for providing a gain control signal;

means responsive to said gain control signal for applying reverse automatic gain control to said emitter circuit;

means for feeding forward a portion of said input signal to said collector circuit;

means for selectively providing drive to said base circuit from said means for supplying input signal, including means for sensing when said gain control signal is of a level indicating the amplitude of the component of signal in said collector circuit attributable to the feed-forward portion of said input signal would be of a magnitude greater than the component that would be attributable to the input signal being amplified by said common-emitter amplifier transistor were its base circuit driven from said means for supplying input signal, and including means responsive to that condition being sensed for interrupting drive otherwise provided to said base circuit from said means for supplying input signal.

3. A gain-controlled amplifier with tuned load comprising:

first and second transistors of the same conductivity type having respective base, emitter and collector electrodes;

an input signal terminal;

impedance means connecting said input signal terminal to a first point;

means for applying the potential at said first point to the base electrode of said first transistor;

a feed-forward capacitor connected between said input signal terminal and said tuned load means;

means for connecting the collector electrode of said first transistor to said tuned load means and to an operating voltage;

means connecting said second transistor for providing between its emitter and collector electrodes an electrically adjustable emitter degeneration resistance for said first transistor, controllable in response to the emitter-to-base potential of said second transistor, including a direct connection of the emitter electrode of said first transistor to the collector electrode of said second transistor, and including a connection of the emitter electrode of said second transistor to a reference voltage and signal ground, and means for applying a temperature-compensated quiescent potential between the emitter electrode of said second transistor and said first point that tends to maintain said second transistor in saturated conduction;

AGC detector means responsive to the amplitude of the response to said input signal appearing at said tuned load for developing an automatic gain control voltage;

transistor means of the same conductivity type as said first and second transistors having base electrode means to which said automatic gain control voltage is applied, having collector electrode means connected to said operating voltage and having first and second emitter electrodes;

means for connecting the first emitter electrode of said transistor means to the base electrode of said second transistor;

means for sensing when the potential at the second emitter electrode of said transistor means is of a level indicating that the amplitude of the response to said input signal appearing at said tuned load is sufficient, that the portion of that response attributable to input signal current fed forward through said feed-forward capacitor exceeds the portion of that response caused by the collector current of said first transistor; and controlled clamping means responsive to that condition being sensed for clamping said first point to said reference voltage, thus interrupting input signal drive otherwise provided to the base electrode of said first transistor.

4. A gain-controlled amplifier as set forth in claim 3 wherein said means for sensing includes:
   a third transistor of the same conductivity type as said first and second transistors, having base and emitter and collector electrodes;
   means for connecting the second emitter electrode of said transistor means to the base electrode of said third transistor;
   means for connecting the emitter electrode of said third transistor to said reference voltage; and
   means for completing the connection of said third transistor as a common-emitter amplifier including a resistive collector load across which a voltage related to said sensed current is provided for controlling said controlled clamping means.

5. A gain-controlled amplifier as set forth in claim 4 wherein said means applying the potential at said first point to the base electrode of said first transistor is
   a fourth transistor of the same conductivity as said first and second transistors, in emitter-follower connection; and wherein said means applying a temperature-compensated quiescent potential between the emitter electrode of said transistor and said first point includes
   a source of first offset potential from said reference voltage, which first offset potential is twice as large as the offset potential across a forward-biased semiconductor junction, would be and includes
   a resistor connected at a first end thereof to said first point and at a second end thereof to receive said first offset potential.

6. A gain-controlled amplifier as set forth in claim 5 wherein said AGC detector means includes:
   a source of second offset potential from said reference voltage, which second offset potential is substantially three times as large as the offset potential across a forward-biased semiconductor junction would be;
   an AGC filter capacitor with a first plate connected to reference voltage and signal ground and with a second plate;
   a resistive path between said source of second offset potential and the second plate of said AGC filter capacitor, a point along said resistive path being connected to the base electrode means of said transistor means;
   an AGC by-pass capacitor bypassing that point along said resistive path to signal ground;
   first and second diode means, with an interconnection therebetween, serially connected across said AGC filter capacitor in a poling to be forward biased by quiescent current flow via said resistive path from said source of second offset potential;
   means responsive to signal appearing across said tuned load for supplying signal to said interconnection between said first and second diode means.

7. A gain-controlled amplifier as set forth in claim 4, 5 or 6 wherein said controlled clamping means includes:
   a further transistor of the same conductivity type as said first and second transistors, having a base electrode to which the collector electrode of said third transistor connects, having an emitter electrode connected to said reference voltage, and having a collector electrode connected to said first point.

8. An amplifier with automatic gain control (AGC) comprising:
   a first bus for reference voltage and signal ground;
   a second bus for operating voltage;
   means for providing a first direct bias voltage offset from said reference voltage in the same sense as said operating voltage by an amount three times what the offset voltage across a single forward-biased semiconductor junction means or diode means would be;
   an AGC filter capacitor having a first plate connected to said first bus and having a second plate;
   a resistive path applying said first direct bias voltage to the second plate of said AGC filter capacitor;
   an AGC by-pass capacitor by-passing a first point in said resistive path to signal ground;
   first and second diode means with an interconnection therebetween serially connected between said first bus and the second plate of said AGC capacitor in such poling as to be forward-biased by the quiescent current flow via said resistive path owing to said first bias voltage;
   first and second transistors of the same conductivity type having respective base and emitter and collector electrodes;
   means for applying, at least at selected times, input signal to the base electrode of said first transistor;
   means, including a first tuned collector load, for connecting the collector electrode of said first transistor to said second bus;
   means connecting said second transistor for providing between its emitter and collector electrodes an electrically adjustable emitter degeneration resistance for said first transistor controllable in response to the emitter-to-base potential of said second transistor, including
   a direct connection of the emitter electrode of said first transistor to the collector electrode of said second transistor;
   a connection of the emitter electrode of said second transistor to said first bus;
   a first current-limiting resistor and a first semiconductor junction means serially connected between said first point in said resistive path and the base electrode of said second transistor for offsetting the base potential of said second transistor towards said reference voltage from the voltage at said first point, and
   means for applying a temperature-compensated first quiescent potential between said first bus and the base electrode of said first transistor that tends to maintain said second transistor in saturated conduction; and
   means responsive to signal appearing across said first tuned collector load to apply signal to said interconnection between said first and second diode means for completing an AGC loop.

9. An amplifier with AGC as set forth in claim 8 wherein said means for completing an AGC loop includes in cascade connection a first detector stage and an intermediate-frequency amplifier stage, said intermediate-frequency amplifier stage comprising:
   third and fourth transistors of the same conductivity type as said first and second transistors, having respective base and emitter and collector electrodes;

means for applying intermediate-frequency signal from said first detector stage to the base electrode of said third transistor;

means, including a second tuned collector load, for connecting the collector electrode of said third transistor to said second bus;

means for applying a portion of the amplified intermediate frequency signal at the collector electrode of said third transistor to said interconnection between said first and second diode means;

means connecting said fourth transistor for providing between its emitter and collector electrodes an electrically adjustable emitter degeneration resistance for said third transistor controllable in response to the emitter-to-base potential of said fourth transistor, including a direct connection of the emitter electrode of said third transistor to the collector electrode of said fourth transistor;

a connection of the emitter electrode of said fourth transistor to said first bus;

a second current-limiting resistor and a second semiconductor junction means connected between a second point in said resistive path and the base electrode of said fourth transistor for offsetting the base potential of said fourth transistor towards said reference voltage from the voltage at said second point; and means for applying a second temperature-compensated quiescent potential between said first bus and the base electrode of said third transistor that tends to maintain said fourth transistor in saturated conduction.

10. An amplifier with AGC, as set forth in claim 9, including
a shunting resistor connected between the collector and emitter electrodes of said fourth transistor for establishing a minimum gain for said intermediate-frequency amplifier stage.

11. An amplifier with AGC, as set forth in claim 8, 9 or 10 wherein a feed-forward capacitor is connected for continuously applying input signal to said first tuned collector load; and wherein said means for applying, at least at selected times, input signal to the base electrode of said first transistor includes:

means for diverting input signal from the base electrode of said first transistor whenever the voltage at said first point in said resistive path falls below a prescribed threshold value respective to said reference voltage.

12. An amplifier with AGC as set forth in claim 9 wherein said means for applying, at least at selected times, input signal to the base electrode of said first transistor includes:

an input signal terminal;

an impedance element having a first end connected to said input signal terminal and having a second end;

a fifth emitter-follower transistor of the same conductivity type as said first transistor having a base electrode to which the second end of said impedance element connects and having an emitter electrode connected to the base electrode of said first transistor; and means for clamping the base electrode of said fifth transistor towards reference voltage to maintain non-conduction of said first transistor whenever the voltage at said first point in said resistive path falls below a prescribed threshold value respective to said reference voltage; wherein a feed-forward capacitor connects said input signal terminal and said first tuned collector load for continually feeding forward input signal thereto; and wherein said means for applying a temperature-compensated first quiescent potential includes in addition to said fifth transistor the following:

means for providing a second direct bias voltage offset from said reference voltage in the same sense as said operating voltage by an amount substantially twice what the offset voltage across a single forward-biased semiconductor junction means or diode means would be; and a base-biasing resistor for applying said second direct bias voltage to the base electrode of said fifth transistor.

13. An amplifier with AGC as set forth in claim 12 wherein said means for providing a first direct bias voltage and said means for providing a second direct bias voltage together comprise:

a first biasing resistance having a first end connected to said second bus and having a second end; and third, fourth and fifth diode means serially connected without substantial intervening impedances in recited order and in forward poling between said first bus and the second end of said first biasing resistance, said first direct bias voltage being provided at the interconnection between said fifth diode means and said biasing resistance, and said second direct bias voltage being provided at the interconnection of said fourth and fifth diode means;

and wherein said means for applying a second temperature-compensated quiescent potential comprises:

a sixth, emitter-follower transistor of the same conductivity type as said third transistor having an emitter electrode connected to the base electrode of said third transistor and having a base electrode connected for including said sixth, emitter-follower transistor in said means for applying intermediate-frequency signal from said first detector stage to the base electrode of said third transistor;

a second biasing resistance having a first end connected to said second bus and having a second end;

a seventh transistor having a collector-to-emitter path connected between said first bus and the second end of said second biasing resistance and having an emitter-base circuit;

means dividing the potential across the collector-to-emitter path of said seventh transistor for application to its emitter-base circuit; and means for applying the potential at the second end of said second biasing resistance to the base electrode of said sixth transistor.

14. An amplifier with AGC as set forth in claim 13 wherein said means for connecting the collector electrode of said first transistor to said second bus includes:

a further transistor of the same conductivity type as said first transistor in cascode connection therewith, having an emitter electrode to which the collector electrodes of said first transistor connects, having a base electrode to which said first direct bias voltage is applied, and having a collector electrode connected via said first tuned collector load to said second bus.

15. The amplifier with AGC as set forth in claim 13 wherein means are connected between said first and second busses for regulating the operating voltage therebetween to increase with the temperature of said transistors.

16. An amplifier with AGC as set forth in claim 8 wherein said means for applying, at least at selected times, input signal to the base electrode of said first transistor includes:

an input signal terminal, an impedance element having a first end connected to said input signal terminal and having a second end, a third emitter-follower transistor of the same conductivity type as said first transistor, having a base electrode to which the second end of said impedance element connects and having an emitter electrode connected to the base electrode of said first transistor, and means for clamping the base electrode of said third transistor towards reference voltage to maintain non-conduction of said first transistor whenever the voltage at said first point in said resistive path (respective to said reference voltage) falls below a prescribed threshold value; wherein a feed-forward capacitor connects said input signal terminal and said first tuned collector load for continually feeding forward input signal thereto; and wherein said means for applying a temperature-compensated first quiescent potential includes in addition to said third transistor the following:

means for providing a second direct bias voltage offset from said reference voltage in the same sense as said operating voltage by an amount substantially twice what the offset voltage across a single forward-biased semiconductor junction means or diode means would be; and a base-biasing resistor for applying said second direct bias voltage to the base electrode of said third transistor.

17. An amplifier with AGC as set forth in claim 12 or 16, wherein said means for providing a first direct bias voltage and said means for providing a second direct bias voltage together comprise:

a first biasing resistance having a first end connected to said second bus and having a second end; and third, fourth and fifth diode means serially connected without substantial intervening impedances in recited order and in forward poling between said first bus and the second end of said first biasing resistance, said first direct bias voltage being provided at the interconnection between said fifth diode means and said biasing resistance, and said second direct bias voltage being provided at the interconnection of said fourth and fifth diode means.

18. An amplifier with AGC as set forth in claim 17 wherein said means for connecting the collector electrode of said first transistor to said second bus includes:

a further transistor of the same conductivity type as said first transistor in cascode connection therewith, having an emitter electrode to which the collector electrode of said first transistor connects, having a base electrode to which said first direct bias voltage is applied, and having a collector electrode connected via said first tuned collector load to said second bus.

19. The amplifier with AGC as set forth in claim 17 wherein means are connected between said first and second busses for regulating the operating voltage therebetween to increase with the temperature of said transistors.

* * * * *

UNITED STATES PATENT AND TRADEMARK OFFICE
CERTIFICATE OF CORRECTION

PATENT NO. : 4,249,137
DATED : February 3, 1981
INVENTOR(S) : Max E. Malchow

It is certified that error appears in the above—identified patent and that said Letters Patent is hereby corrected as shown below:

Column 11, line 26      "in" should be --IN--.

Signed and Sealed this

Fourth Day of August 1981

[SEAL]

Attest:

GERALD J. MOSSINGHOFF

Attesting Officer     Commissioner of Patents and Trademarks